US012548731B2

(12) United States Patent
Bischoff et al.

(10) Patent No.: US 12,548,731 B2
(45) Date of Patent: Feb. 10, 2026

(54) SYSTEMS AND METHODS FOR TRANSFERRING A SAMPLE

(71) Applicant: FEI Company, Hillsboro, OR (US)

(72) Inventors: Maarten Bischoff, Uden (NL); Ondřej Ludmil Shánĕl, Brno (CZ)

(73) Assignee: FEI Company, Hillsboro, OR (US)

( * ) Notice: Subject to any disclaimer, the term of this patent is extended or adjusted under 35 U.S.C. 154(b) by 649 days.

(21) Appl. No.: 18/051,586

(22) Filed: Nov. 1, 2022

(65) Prior Publication Data

US 2024/0112879 A1 Apr. 4, 2024

Related U.S. Application Data

(60) Provisional application No. 63/377,751, filed on Sep. 30, 2022.

(51) Int. Cl.
*H01J 37/20* (2006.01)
*H01J 37/26* (2006.01)

(52) U.S. Cl.
CPC .............. *H01J 37/20* (2013.01); *H01J 37/26* (2013.01); *H01J 2237/2003* (2013.01); *H01J 2237/204* (2013.01)

(58) Field of Classification Search
CPC .... H01J 37/20; H01J 37/26; H01J 2237/2003; H01J 2237/204; H01J 37/18
See application file for complete search history.

(56) References Cited

U.S. PATENT DOCUMENTS

| | | | | |
|---|---|---|---|---|
| 8,716,676 | B2 * | 5/2014 | Safar | H01J 37/20 250/442.11 |
| 9,514,913 | B2 * | 12/2016 | Foord | H01J 37/22 |
| 9,658,246 | B2 * | 5/2017 | Konings | H01J 37/26 |
| 10,242,841 | B2 * | 3/2019 | Miyazaki | H01J 37/20 |
| 10,551,285 | B2 * | 2/2020 | Gaechter | H01J 37/185 |
| 10,768,124 | B2 * | 9/2020 | Miyazaki | H01J 37/20 |
| 11,942,231 | B2 * | 3/2024 | Ito | G21F 7/04 |
| 11,994,663 | B2 * | 5/2024 | Zandbergen | H01J 37/20 |
| 2009/0078060 | A1 * | 3/2009 | Moore | G01N 1/286 422/63 |
| 2012/0120226 | A1 * | 5/2012 | de Jonge | H01J 37/20 348/80 |
| 2015/0107988 | A1 * | 4/2015 | Yamazaki | C30B 23/08 204/192.25 |

(Continued)

FOREIGN PATENT DOCUMENTS

EP 2 182 545 A1 5/2010

OTHER PUBLICATIONS

Extended European Search Report issued in European Patent Application No. EP 23199765.1, mailed Feb. 16, 2024.

(Continued)

*Primary Examiner* — David A Vanore
(74) *Attorney, Agent, or Firm* — BakerHostetler

(57) ABSTRACT

Systems and methods for transferring a sample from a transmission electron microscope (TEM) column are described herein. In one aspect, a method can include transferring a sample positioned in a holder capsule of a TEM sample holder from a vacuum chamber of a TEM into a load lock of the TEM; filling the load lock with a protecting gas; sealing the holder capsule of the TEM sample holder under the protecting gas; and removing the TEM sample holder from the load lock.

20 Claims, 6 Drawing Sheets

(56) References Cited

U.S. PATENT DOCUMENTS

| | | | | |
|---|---|---|---|---|
| 2015/0340199 | A1* | 11/2015 | Nagakubo | H01J 37/20 250/443.1 |
| 2016/0027612 | A1* | 1/2016 | Fischione | H01J 37/3056 250/311 |
| 2017/0278667 | A1* | 9/2017 | Iwahori | H01J 37/20 |
| 2019/0287755 | A1* | 9/2019 | Kataoka | H01J 37/261 |
| 2020/0144020 | A1* | 5/2020 | Walden, II | G01F 25/00 |
| 2020/0185187 | A1* | 6/2020 | Negishi | H01J 37/20 |
| 2022/0115204 | A1* | 4/2022 | Chen | H01J 37/261 |
| 2023/0245850 | A1* | 8/2023 | Novák | H01J 37/185 250/442.11 |
| 2023/0377834 | A1* | 11/2023 | Hrouzek | H01J 37/20 |
| 2024/0112879 | A1* | 4/2024 | Bischoff | H01J 37/20 |

OTHER PUBLICATIONS

Shukla, "New electron microscopy tools for characterizing air-sensitive samples", Microscopy and Microanalysis, vol. 27, Issue S1, pp. 1340-1341, 2021.

Leontowich, et al., "Cryo scanning transmission x-ray microscope optimized for spectrotomography", Review of Scientific Instruments, vol. 89, Issue 9, 2018.

* cited by examiner

SYSTEMS AND METHODS FOR TRANSFERRING A SAMPLE

CROSS-REFERENCE TO RELATED APPLICATIONS

This application claims benefit to U.S. Provisional Application No. 63/377,751, filed Sep. 30, 2022, the entirety of which is incorporated by reference herein.

TECHNICAL FIELD

This disclosure relates to systems and computer-implemented methods for transferring a sample into or out of a charged particle microscope.

BACKGROUND

A beam microscope, such as a transmission electron microscope (TEM), can be used to conduct research in air sensitive materials. For example, catalysts and batteries can degrade or react when exposed to ambient environments. TEM systems are advantageous to use with these materials due to the ability of the TEM systems to analyze at the atomic scale, as well as the ability of TEM systems to place the microscope column under vacuum. For example, materials that are used in Li-based batteries are very sensitive to air (e.g., water, oxygen), and even a limited exposure to air (e.g., 10 seconds) can dramatically change the structure of such materials. Thus, there is a need for improved sample transfer systems and methods for transferring air-sensitive samples.

SUMMARY

Systems and methods for transferring a sample into and out of a charged particle microscope, such as a transmission electron microscope (TEM), are described herein. In one example, transferring a sample out of a vacuum chamber of a TEM comprises: transferring the sample positioned in a holder capsule of a TEM sample holder from the vacuum chamber of the TEM into a load lock of the TEM; filling the load lock with a protecting gas; sealing the holder capsule of the TEM sample holder under the protecting gas; and removing the TEM sample holder from the load lock. In another example, transferring a sample into a vacuum chamber of a TEM comprises: coupling a TEM sample holder to a load lock of the TEM; providing a first vacuum in the load lock; filling the load lock with a protecting gas; unsealing a holder capsule of the TEM sample holder in the load lock, wherein the sample is positioned in the holder capsule; providing a second vacuum in the load lock; and transferring the sample from the load lock to the vacuum chamber of the TEM. In this way, the sample can be transferred into and out of the TEM, as well as between tools, under protecting gas using a TEM sample holder.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various aspects discussed in the present document. In the drawings.

DETAILED DESCRIPTION

Figure 1:
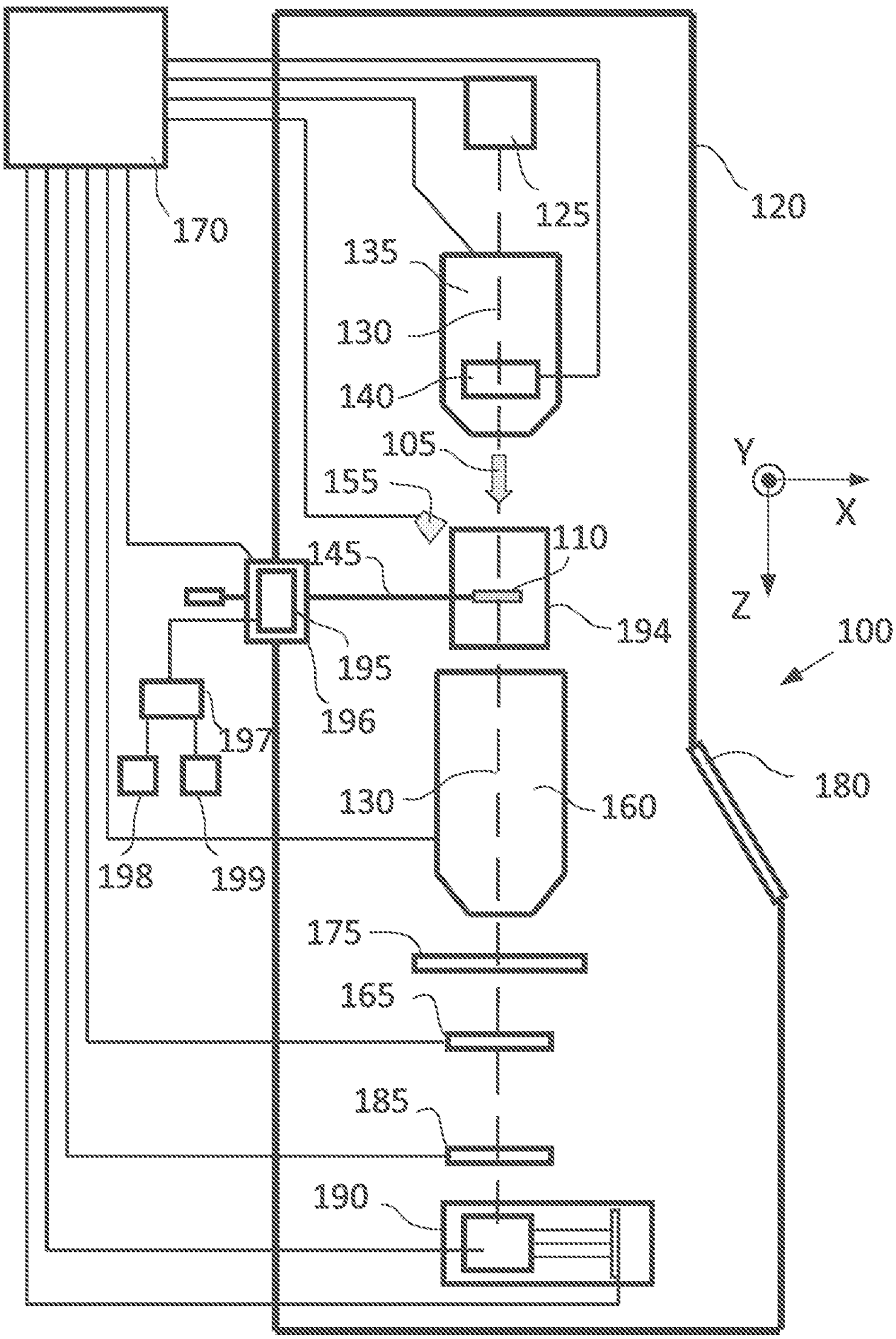
FIG. 1 depicts a transmission electron microscope (TEM) system.

The present disclosure may be understood more readily by reference to the following detailed description and the examples included therein.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing. All publications, patent applications, patents and other references mentioned herein are incorporated by reference in their entirety. The materials, methods, and examples disclosed herein are illustrative only and not intended to be limiting.

The singular forms "a," "an," and "the" include plural referents unless the context clearly dictates otherwise.

As used in the specification and in the claims, the term "comprising" can include "consisting of" and "consisting essentially of" The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where “about” is used before a quantitative value, the parameter also includes the specific quantitative value itself, unless specifically stated otherwise.

Unless indicated to the contrary, the numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently of the endpoints. The endpoints of the ranges and any values disclosed herein are not limited to the precise range or value; they are sufficiently imprecise to include values approximating these ranges and/or values.

As used herein, approximating language can be applied to modify any quantitative representation that can vary without resulting in a change in the basic function to which it is related. Accordingly, a value modified by a term or terms, such as “about” and “substantially,” may not be limited to the precise value specified, in some cases. In at least some instances, the approximating language can correspond to the precision of an instrument for measuring the value. The modifier “about” should also be considered as disclosing the range defined by the absolute values of the two endpoints. For example, the expression “from about 2 to about 4” also discloses the range “from 2 to 4.” The term “about” can refer to plus or minus 10% of the indicated number. For example, “about 10%” can indicate a range of 9% to 11%, and “about 1” can mean from 0.9-1.1. Other meanings of “about” can be apparent from the context, such as rounding off, so, for example “about 1” can also mean from 0.5 to 1.4. Further, the term “comprising” should be understood as having its open-ended meaning of “including,” but the term also includes the closed meaning of the term “consisting.” For example, a composition that comprises components A and B can be a composition that includes A, B, and other components, but can also be a composition made of A and B only. Any documents cited herein are incorporated by reference in their entireties for any and all purposes.

In order to protect the air-sensitive sample during sample transfer between tools, the sample can be transferred using inert gas sample holders. With such a holder, the air-sensitive sample can be transferred from a glovebox to the microscope in an inert gas (e.g. argon) environment. As an example, a TEM holder is disclosed in U.S. Pat. No. 10,242,841B2, which is incorporated by reference herein, wherein the TEM holder can be sealed under argon gas. However, applicant recognizes that because load lock chambers of the TEM systems are compact, it is not possible to seal/unseal such inert gas sample holder in the load lock. For example, after placing the sample in the load lock and the load lock has been pumped down (e.g., to remove the environment of the load lock), the sample is inserted into the high vacuum chamber (e.g. sample chamber) of the microscope. If the inert gas sample holder is unsealed in the high vacuum chamber of the microscope, inert gas contained in the holder can be released into the high vacuum chamber and affect its vacuum level. Further, once the holder is unsealed, it can no longer be resealed under inert gas in the TEM. Therefore, the sample is typically transferred out of the TEM under vacuum. In other words, it is not possible to remove the fragile sample from the TEM under a protecting atmosphere, such as under inert gas. Sample transfer under vacuum is not optimal because external air may easily enter the sealed sample holder and damage the air-sensitive sample.

Systems and methods for transferring a sample from a transmission electron microscope (TEM) column are described herein. Transferring a sample into a vacuum chamber of a TEM comprises: coupling a TEM sample holder to a load lock of the TEM; providing a first vacuum in the load lock; filling the load lock with a protecting gas; unsealing a holder capsule of the TEM sample holder, wherein the sample is positioned in the holder capsule; providing a second vacuum in the load lock; and transferring the sample from the load lock to the vacuum chamber of the TEM. Transferring a sample out of a vacuum chamber of a TEM comprises: transferring the sample positioned in a holder capsule of a TEM sample holder from the vacuum chamber of the TEM into a load lock of the TEM; filling the load lock with a protecting gas; sealing the holder capsule of the TEM sample holder under the protecting gas; and removing the TEM sample holder from the load lock. In this way, the sample can be transferred into and out of the vacuum chamber of the TEM under the protecting gas.

In an example, coupling the TEM sample holder to the load lock comprises coupling the TEM sample holder to a goniometer for positioning the sample within the vacuum chamber of the TEM. The sample can be imaged and/or processed in the vacuum chamber under charged particle beams while being held by the TEM sample holder in the vacuum chamber. The load lock is a part of the goniometer.

In some cases, sealing the holder capsule under the protecting gas in the load lock includes sealing the holder capsule when a pressure of the protecting gas in the load lock is over 1 atm. Comparing to sealing the holder capsule under vacuum, sealing the holder capsule under a gas pressure over 1 atm can mitigate possible air leakage into the capsule, thereby mitigating the possibility that the contained sample is exposed to external environments during sample transfer.

In some cases, the protecting gas is selected according to a type of the sample, such as sample composition. The protecting gas can include one or more gas types that do not react with the sample. For example, nitrogen can interact with compositions including lithium. Thus, nitrogen might not be selected as the protecting gas when the sample contains lithium. Another gas type, such as argon, can be used as the protecting gas. In one example, the protecting gas can include inert gases including argon, helium, xenon, neon, or a combination thereof.

In some cases, the holder capsule can be sealed by operating the TEM holder. When the holder capsule is sealed, the TEM sample holder defines a cavity that houses the sample in the holder capsule. The rest of the cavity is filed with the protecting gas or under vacuum.

In some cases, the TEM sample holder is in a shape of a rod, and coupling the TEM sample holder with the load lock includes inserting at least the distal end of the rod into the load lock. The holder capsule locates near the distal end that is inserted into the load lock.

In one example, the TEM sample holder includes a cylindrical part located at a distal end of the TEM sample holder, and sealing the holder capsule comprises retrieving the holder capsule into the cylindrical part. The holder capsule can in some cases be extended from the cylindrical part to unseal the holder capsule, which exposes the TEM sample holder and any corresponding sample to the environment outside of the holder capsule.

In some cases, the protecting gas and the vacuum in the load lock can be provided by a gas delivery train coupled to the load lock. The gas delivery train can include a first valve for controlling the gas removed from the load lock and a second valve for controlling the protecting gas flowing into the load lock.

In some cases, filling the load lock with the protecting gas includes opening a valve in fluid communication with a protecting gas source so as to effect fluid communication of the protecting gas into the load lock; and closing the valve based at least in part on one or more of: (a) a duration of a time period during which the valve places the load lock in fluid communication with the protecting gas source; or (b) a pressure value within the load lock. The amount of gas flowed into the load lock can be regulated. This can be accomplished either by measuring the pressure directly (e.g., as the dimensions of the load lock are known), or by monitoring the time period with which the gas is flowed into the load lock. Knowing the time period that the gas is flowed, along with a general flow rate, will provide the amount of gas flowed into the load lock.

In some cases, the method of transferring a sample out of a vacuum chamber of a TEM can further include sealing the load lock from the vacuum chamber of the TEM after transferring the sample into the load lock and before filling the load lock with the protecting gas. The load lock can be sealed from the vacuum chamber by a valve between the load lock and the TEM vacuum chamber. The valve can be an airlock ball valve. When the sample, positioned in the holder capsule, is moved from the vacuum chamber into the load lock, the valve can be closed, so that the vacuum chamber is sealed from the load lock.

In some cases, the method can further comprise imaging or processing the sample in the vacuum chamber of the TEM. The imaging can occur via a charged particle source generating a charged particle beam that interacts with the specimen. A detector or camera can capture portions of the charged particle beam, or emissions resulting from the charged particle beam interacting with the sample, to produce an image.

In one example, an apparatus for sample transfer comprises a load lock defining a chamber for receiving a distal end of a TEM sample holder including a holder capsule, wherein the holder capsule is sealable within the chamber; a gas delivery train configured to place the chamber into interruptible fluid communication with both at least a protecting gas source and with at least a vacuum pump.

The gas delivery train can provide interruptible fluid connection between the load lock and the vacuum pump or between the load lock and the protecting gas source via multiple valves. In one example, the gas delivery train includes a first valve coupled between the load lock and the protecting gas source and a second valve coupled between the load lock and the vacuum pump. The gas delivery train may include a third valve to seal the load lock from both the protecting gas source and the vacuum pump. The load lock may include a pressure sensor for measuring the pressure within the load lock.

In this way, the holder capsule, wherein the sample is positioned in during sample transfer, can be configured to seal and unseal (close and open) within the load lock of a TEM. This can provide multiple advantages. For example, the environment that the sample is exposed to can be better controlled. In the case of transferring the sample into the TEM, the environment of the load lock can be adequately prepared for the sample prior to exposing the sample (e.g., opening the sample holder) to the environment. Once the holder capsule is opened, both the environment in the sample chamber and pressure of the load lock can be adjusted prior to transferring the sample from the load lock to the sample chamber.

Likewise, in the case of transferring the sample from the sample chamber to the load lock, the environment of the load lock can be prepared for receiving the sample from the sample chamber of the column. Once the sample is transferred into the load lock from the sample chamber, the environment of the load lock can then be altered in preparation for transferring the sample external to the load lock (e.g., to a glove box). The holder capsule can be closed within the load lock to seal the sample within the holder capsule under the protecting gas, and then transferred external to the load lock.

Sealing and unsealing the holder capsule within the load lock can reduce the possibility that a sample positioned in the holder capsule is exposed to adverse conditions that may damage the sample. For example, problems exist with transferring the sample from the vacuum of the column to external to the microscope, including the inability to isolate the sample from the external environment (e.g., due to the inability of conventional systems to close the hold capsule prior to transferring the sample to the external environment). The methods and systems described herein mitigate, or potentially eliminate, these problems, which can lead to maintaining the integrity of the sample both entering and exiting the charged particle system.

Turning to FIG. 1, FIG. 1 depicts a microscopy system 100, particularly a transmission electron microscopy (TEM) system 100 configured to use an electron beam 105 to observe and/or characterize a sample 110. Additionally, the TEM system 100 can be a transmission-type microscopy system 100, wherein an image of the sample 110 is taken using the emissions in the transmission region of the TEM system 100. Thus, 100 can represent a Transmission Electron Microscope (TEM) or a Scanning Transmission Electron Microscope (STEM).

Within a vacuum enclosure 120, an electron source 125 can produce the beam 105 of electrons that propagates along an electron-optical axis 130 and traverses an electron-optical illuminator 135, serving to direct/focus the electrons onto a chosen part of the sample 110 positioned in sample chamber 194. Sample 110 can be, e.g., be (locally) thinned/planarized or otherwise processed for analysis.

Also depicted is a deflector 140, which can, inter alia, be used to effect scanning motion of the beam 105. The sample 110 can be held on a sample holder 145 that can be positioned in multiple degrees of freedom by a goniometer 196. For example, the sample 110 can be positioned in a holder capsule of the sample holder that can be moved (inter alia) in the XY plane (see the depicted Cartesian coordinate system; typically, motion parallel to Z and tilt about X/Y will also be possible). Such movement allows different parts of the sample 110 to be illuminated/imaged/inspected by the electron beam 105 traveling along axis 130 (in the Z direction) (and/or allows scanning motion to be performed, as an alternative to beam scanning). If desired, an optional cooling device (not depicted) can be brought into intimate thermal contact with the sample holder 145, so as to maintain it (and the sample 110 thereupon) at cryogenic temperatures, for example. The holder capsule of the sample holder can be sealable, so that the sample can be transferred into and out of the TEM under vacuum or inert gas.

Figure 4A:
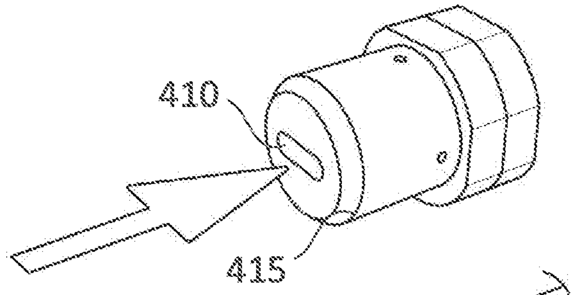
FIG. 4A depicts a distal end of an example sample holder for transferring a sample to/from a TEM in a closed position.
Figure 4B:
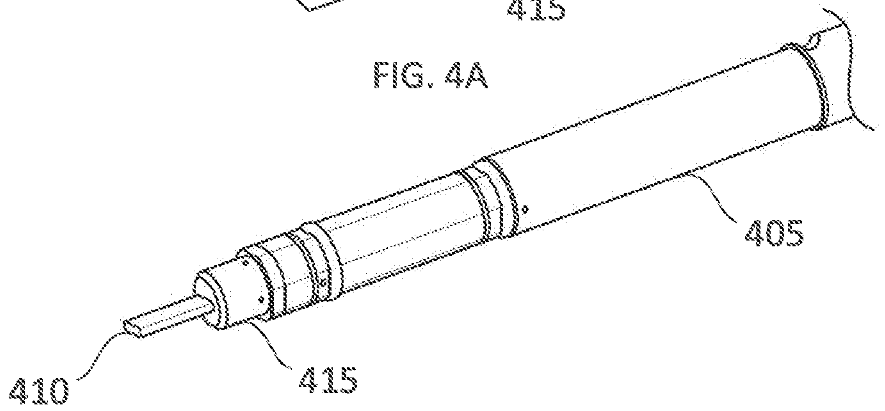
FIG. 4B depicts the sample holder of FIG. 4A in an opened position.

The sample holder can be in the form of a long rod with two distal ends. The sample holder includes a holder capsule at one distal end wherein the sample, such as the TEM grid, is positioned in. The sample can be transferred into the sample chamber by inserting one distal end of the sample holder into the TEM column via the load lock. The sample can be imaged or processed by the charged particle beam while being held by the sample holder. The holder capsule is sealable from the external environment. In one example, as shown in FIG. 4A, one distal end of the holder 405 includes a holder capsule 410 for positioning a sample in the sample holder 405. The holder capsule 410 can be capable of retracting (as indicated by the arrow) within a cavity defined by cylindrical part 415 of the sample holder 405, such that, when in a sealed (or closed) position shown in FIG. 4A, the defined cavity can house both the sample and a volume of gas or vacuum (e.g., the volume positioned between a top face of the sample and a top face of the defined cavity). Further, when closed, the holder capsule 410 of the sample holder 405 can substantially be sealed in the defined cavity, thereby isolating the sample from the external environment. FIG. 4B shows the holder capsule 410 extending distally away from (e.g., in a direction along the length of the sample holder) the cylindrical part 415, which can expose the sample to the external environment. One skilled in the art will understand that the shape of the defined cavity can include different geometrical shapes. In another example, instead of retracting or retrieving the holder capsule, the cylindrical part of the sample holder may be extended distally towards the holder capsule to seal the holder capsule. In yet another example, the holder capsule can be sealed by a sliding mechanism, such as a sliding cover.

Turning back to FIG. 1, the electron beam 105 can interact with the sample 110 in such a manner as to cause various types of "stimulated" radiation to emanate from the sample 110, including (for example) secondary electrons, backscattered electrons, X-rays and optical radiation (cathodoluminescence). If desired, one or more of these radiation types can be detected with the aid of analysis device 155, which might be a combined scintillator/photomultiplier or EDX (Energy-Dispersive X-Ray Spectroscopy) module. However, alternatively or supplementally, one can study electrons that traverse (pass through) the sample 110, exit/emanate from the sample 110, and continue to propagate (substantially, though generally with some deflection/scattering) along axis 130.

Such a transmitted electron flux enters an imaging system (projection lens) 160, which can comprise a variety of electrostatic/magnetic lenses, deflectors, correctors (such as stigmators), and the like. In normal (non-scanning) TEM mode, this imaging system 160 can focus the transmitted electron flux. Various types of analysis apparatus can be used downstream of imaging system 160, such as a TEM camera 165. At camera 165, the electron flux can form a static image (or diffractogram) that can be processed by controller/processor 170 and displayed on a display device (not depicted), such as a flat panel display, for example. When not required, camera 165 can be retracted/withdrawn so as to get it out of the way of axis 130. Alternatively, or additionally, the imaging system 160 can be used to focus the transmitted electron flux onto a fluorescent screen 175, which, if desired, can be retracted/withdrawn so as to get it out of the way of axis 130. An image (or diffractogram) of (part of) the sample 110 will be formed by imaging system 160 on screen 175, and this can be viewed through viewing port 180.

An analysis apparatus can also include a STEM camera 185. An output from camera 185 can be recorded as a function of (X,Y) scanning position of the beam 105 on the sample 110, and an image can be constructed that is a "map" of output from camera 185 as a function of X,Y. Camera 185 can include a single pixel with a diameter of e.g. 20 mm, as opposed to the matrix of pixels characteristically present in camera 165. Moreover, camera 185 will generally have a much higher acquisition rate (e.g., $10^6$ points per second) than camera 165 (e.g., $10^2$-$10^3$ images per second). Once again, when not required, camera 185 can be retracted/withdrawn so as to get it out of the way of axis 130.

As an alternative to imaging using cameras 165 or 185, one can also invoke spectroscopic apparatus 190, which could be an Electron Energy Loss Spectroscopy (EELS) module, for example. It should be noted that the order/location of items 165, 185, and 190 is not strict, and many possible variations are conceivable. For example, spectroscopic apparatus 190 can also be integrated into the imaging system 160.

The controller 170 is connected to various illustrated components via control lines (buses). The controller includes at least a processor as well as a non-transitory memory for storing computer readable instructions. By executing the computer readable instructions in the processor, this controller 170 can provide a variety of functions, such as synchronizing actions, providing setpoints, processing signals, performing calculations, and displaying messages/information on a display device (not depicted). The controller can be configured to implement some or all steps of the methods described herein. The controller 170 can be (partially) inside or outside the enclosure 120, and can have a unitary or composite structure, as desired.

The goniometer 196 can position the sample under the electron beam within a vacuum chamber of the microscope. The vacuum chamber can be a sample chamber 194. The sample can be imaged or processed with the charged particle beams in the sample chamber. The goniometer 196 can be coupled with enclosure 120. The goniometer can include one or more actuation mechanisms for tilting the sample around one or more tilt axes.

The goniometer 196 includes a load lock 195 to facilitate the transfer of sample 110 from external to the microscope 100 to within the sample chamber. The load lock 195 can include ingress/egress points for the sample 110 to transition from the external of the TEM to the load lock 195, and from the load lock 195 to the sample chamber of the microscope column 100. For example, the load lock 195 can include an opening at one end for receiving a sample holder from the external of TEM. The load lock can be sealable from the external environment via one or more O-rings. Similarly, the load lock 195 can also include an opening on another end (e.g. opposite end) for passing the sample held by the sample holder from the load lock 195 to the sample chamber of the microscope. The opening between the load lock and the sample chamber is sealable via a valve. Thus, when the sample 110 is positioned within the load lock 195 (via the sample holder), the environment of load lock can be substantially isolated from sample chamber.

The goniometer 196 can include a gas delivery train 197 to place the chamber into interruptible fluid communication with both a protecting source 198 and with a vacuum pump 199. The load lock 195 can be coupled with one or more gas sources and pumps via valves for controlling the gas flow into and out of the load lock 195. In one example, the load lock can be fluidically connected to a vacuum pump 199 via a first valve and fluidically connected to a protecting gas source 198 via a second valve. The valves can be open or closed by actuation respective actuators controlled by the controller 170.

The TEM system can include other type of transmission electron microscopy system such as a scanning transmission electron microscope. In some examples, the TEM system can include another charged particle column such as an ion column.

Figure 2:
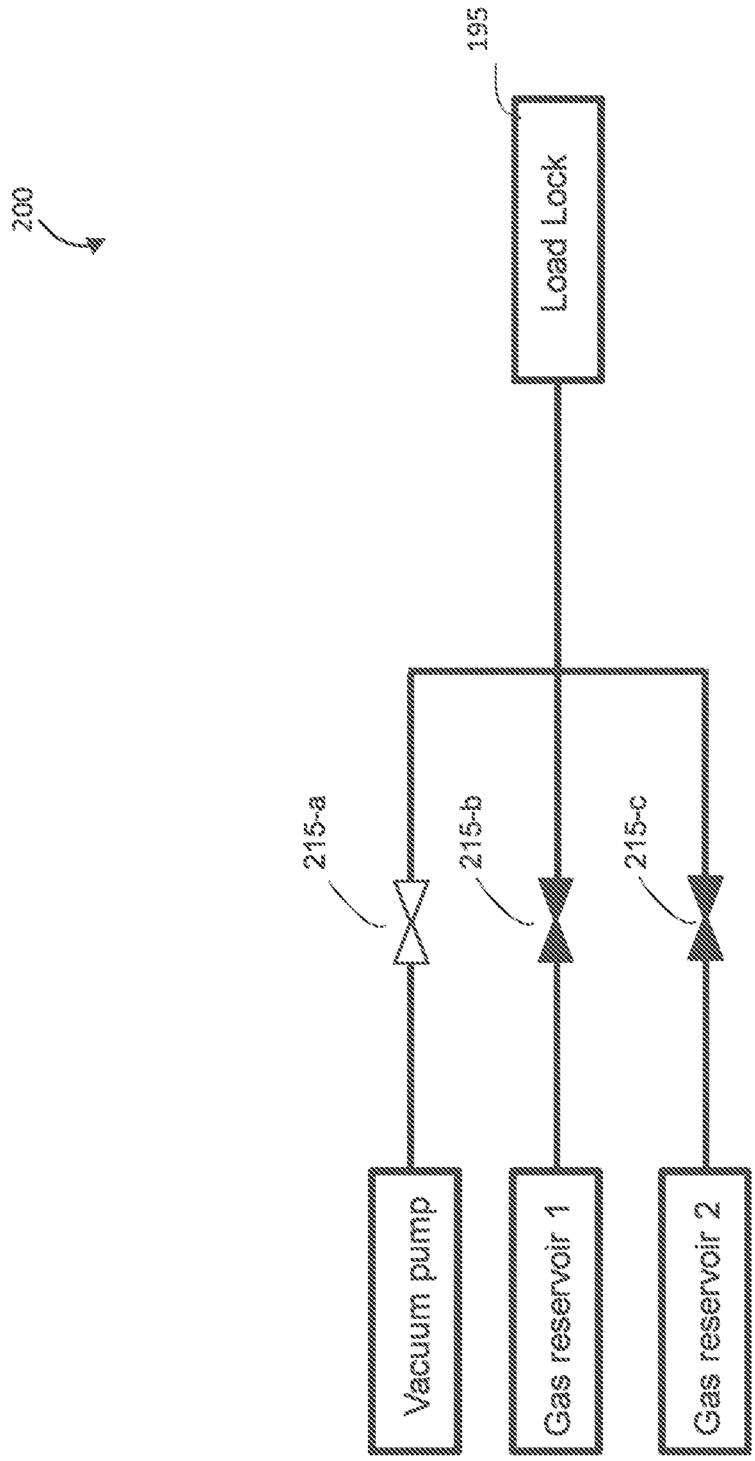
FIG. 2 depicts a gas delivery train for a TEM.

FIG. 2 depicts a gas delivery train 200 of a TEM according to the present disclosure. The gas delivery train 200 can be, for example, fluidically coupled to load lock 195 as described with reference to FIG. 1.

The gas delivery train 200 can include a variety of valves for transmitting fluid to or from the chamber of the load lock 195. For example, the gas delivery train 200 can include valves 215-*b* and 215-*c* fluidically coupled to one or more gas reservoirs. When opened, valve 215-*b* or 215-*c*, or both, can facilitate the passing of fluid from an external source (e.g., a fluidically coupled inert gas source) to the load lock chamber. The fluid can be a protecting gas that does not interact with the sample when in the load lock chamber. For example, the protecting gas can include argon, helium, neon, and the like. However, a fluid can be chosen for insertion into the load lock chamber based on the particular sample that is to be imaged by the microscope (e.g., microscope 100 of FIG. 1). Further, the number of gas reservoirs coupled to the load lock, and thus the number of valves implemented in the gas delivery train 200 can vary. While two valves are shown in FIG. 2, the gas delivery train can include at least one valve for coupling to each gas reservoir.

The gas delivery train can also include one or more valves for facilitating the removal of fluid within the load lock chamber. For example, the gas delivery train 200 can also include a valve 215-*a*, which can be fluidically coupled to a vacuum pump. The valve 215-*a* can couple the load lock chamber to an apparatus for creating a vacuum, such as a vacuum pump (e.g., a pre-vacuum pump like a rotary pump, a high vacuum pump like a Turbomolecular pump, and the like). When opened, the valve 215-*a* can facilitate the flow of fluid from the load lock chamber to the external environment (e.g., via the coupled vacuum pump). If left opened for a particular period of time, the valve 215-*a* (e.g., with a coupled, activated vacuum pump) can facilitate the creation of a vacuum environment within the load lock chamber.

The valve actuator can actuate a corresponding valve that transitions the fluid pathway between a corresponding valve (e.g., vacuum pump, gas reservoir, and the like) and the load lock chamber. A given valve actuator can transition a corresponding pathway between open and closed via the corresponding valve. The valve actuator can be in electronic communication with a controller, such as controller 170 of FIG. 1, which can control the valve actuators to open and close the fluid pathways. Further illustrations of these fluid pathways, and corresponding valves, are depicted in FIGS. 3A and 3B.

Figure 3A:
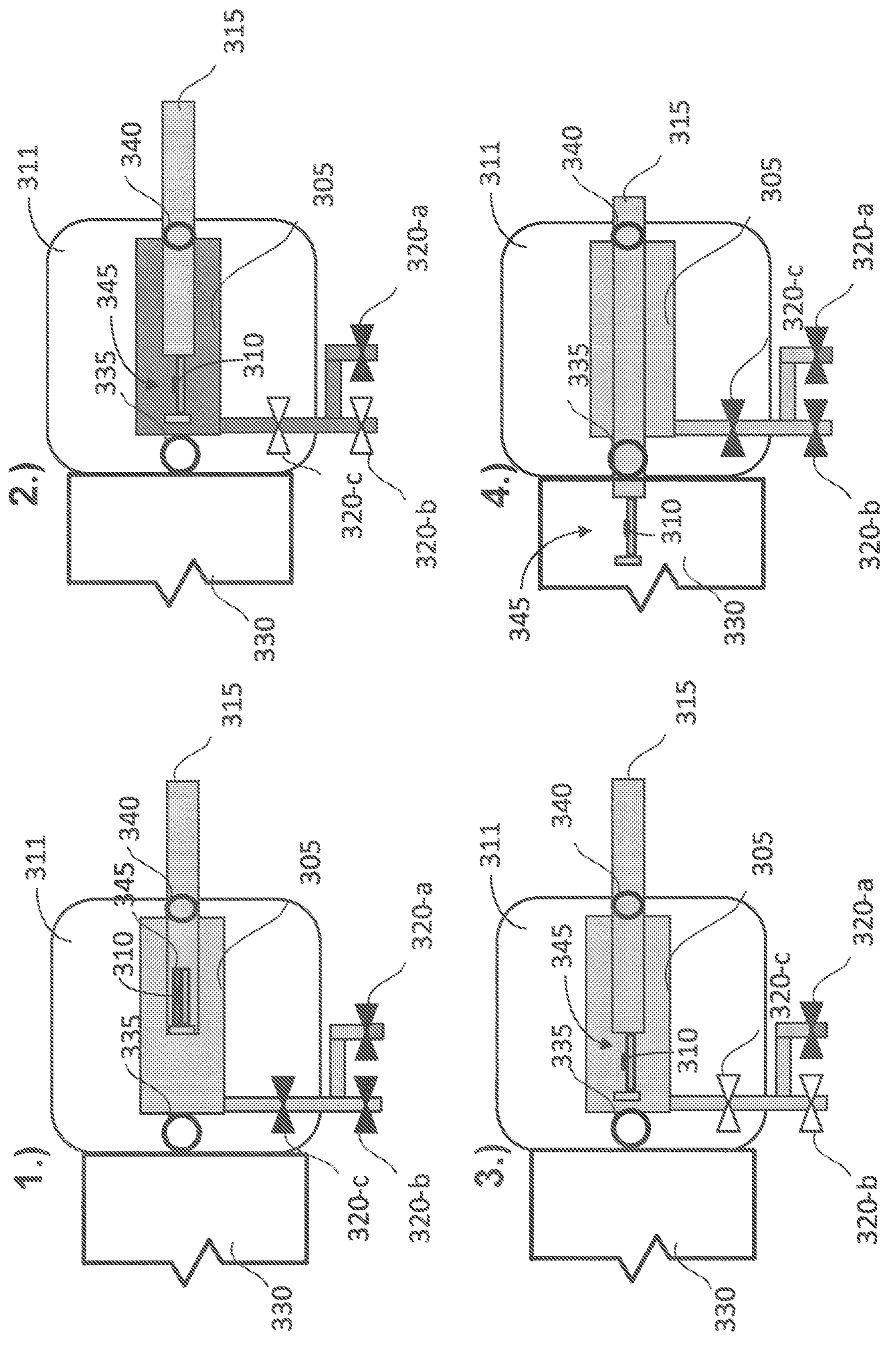
FIG. 3A depicts an example process for transferring a sample to a TEM.
Figure 3B:
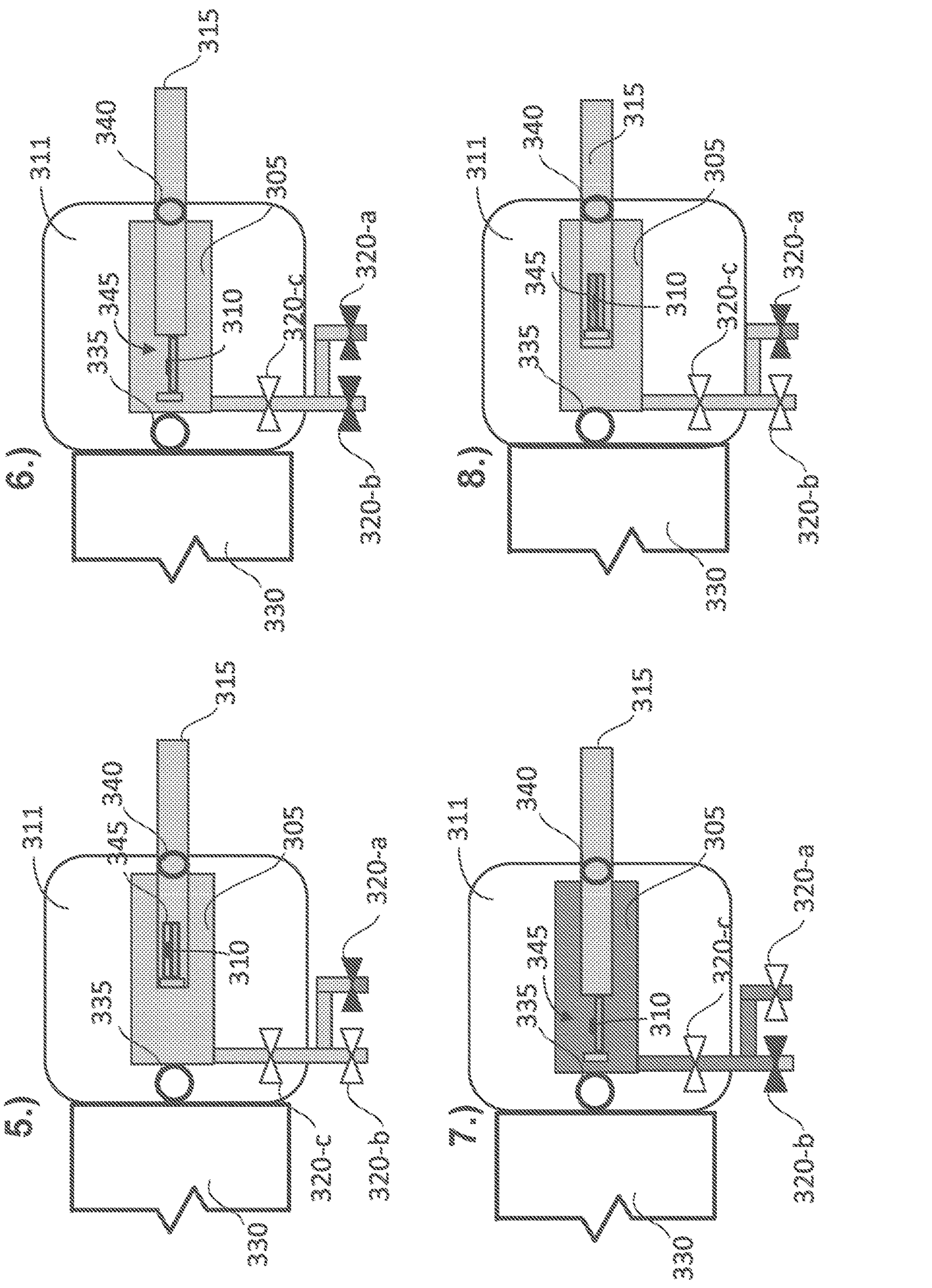
FIG. 3B depicts an example process for transferring a sample from a TEM.

FIG. 3A and FIG. 3B depict a process for transferring a sample to and from a sample chamber of the TEM column according to the present disclosure. A part of the goniometer including the load lock 305 is shown. The load lock can be fluidically coupled to the sample chamber 330 via valve 335. The gas delivery train includes valve 320-*c* coupled between the load lock and the gas delivery train, valve 320-*b* coupled between valve 320-*c* and at least one vacuum pump, and valve 320-*a* coupled between valve 320-*c* and one or more gas sources including the protecting gas source. The process can be performed by system 100 of FIG. 1, and in some cases can be performed, at least partially, by controller 170 of FIG. 1. It should be noted that the valve configuration illustrated in FIGS. 3A and 3B is a particular configuration. The gas delivery train fluidically coupled to the load lock 305 can include different configurations for the valve. For example, valve 320-*c* can be optional, such that valves 320-*a* and 320-*a* have a direct connection to the load lock 305. In some cases, there can be multiple valves 320-*a*, where each is fluidically coupled to a respective gas reservoir (e.g., such as the valves 215-*b* and 215-*c* depicted in FIG. 2.

As shown in FIG. 3A, at Stage 1), the distal end of the sample holder 315, which can be, e.g., sample holder 145 of FIG. 1, is inserted into the load lock 305 (which can be an example of load lock 195 of FIG. 1) of the goniometer 311. In some cases, such as side entry holder TEM systems, the distal end of the sample holder can be inserted into the load lock by operating the sample holder (e.g., by moving the entire sample holder towards the sample chamber). The load lock 305 is fluidically coupled with the sample chamber 330 of the TEM column via an opening. The opening is sealed by a valve 335, which can be an airlock ball valve. Similarly, the load lock 305 can be sealed from ambient from O-ring 340, which can be coupled to the sample holder 315. The holder capsule 345 at the distal end of the sample holder is sealed, such that the sample 310 and a volume of protecting gas can be enclosed in a defined cavity of sample holder. The valves 320-*a*, 320-*b*, and 320-*c* are in a closed position, thereby closing the fluid pathways of the load lock. The load lock is at ambient pressure for receiving the sample holder.

At Stage 2), the valves 320-*b* and 320-*c* are opened, (e.g., via valve actuators), which open a fluid pathway between the vacuum pump and the load lock. The load lock is then evacuated. The holder capsule of the sample holder is opened, which exposes the sample to the vacuum environment contained in the load lock chamber. Any protective gas contained within the holder capsule can then leak into the load lock 305.

At Stage 3), the gas in the load lock 305 (e.g., originating from the holder capsule) is evacuated of any gas via the vacuum pump.

At Stage 4), the distal end of the sample holder (in an open position) is inserted into the sample chamber via valve 335, and the vacuum in the load lock is sustained via the sample chamber. Valves 320-*a*, 320-*b* and 320-*c* are closed, thereby closing the fluid pathway from the vacuum pump to the load lock. In some cases, such as for side entry TEM system, the distal end of the sample holder can be inserted into the sample chamber by moving the entire holder relative to the load lock.

The process described above (Stages 1-4) can thus control the environmental conditions the sample experiences, which can mitigate damage or degradation to the sample. Further, the process described above also allows for the control of pressure gradients the sample can experience. Both the composition and the pressure the sample experiences while being transferred from the external environment to the microscope column can be controlled with granularity, such that the sample does not experience pressure swings that damage the sample.

FIG. 3B depicts a process for transferring a sample from a TEM column according to the present disclosure. The process can be performed by system 100 of FIG. 1, and in some cases can be performed, at least partially, by controller 170 of FIG. 1. In some cases, the process can be performed after the process for transferring the sample to the TEM discussed with reference to FIG. 3A.

At Stage 5), the sample 310, positioned in the holder capsule 345, is moved from the microscope column and into the vacuum pumped chamber of the load lock 305. The sample is sealed in the holder capsule. The holder capsule can be sealed before the sample is transferred to the load lock. Alternatively, in some cases, the holder capsule can be transferred from the sample chamber to the load lock unsealed.

Valves 320-*b* and 320-*c* are open and valve 320-*a* is closed. In some cases, the load lock is under proper vacuum prior to the transfer. In some cases, valves 320-*b* and 320-*c* may be opened before transferring the sample into the load lock to provide vacuum to the load lock. In some cases, valves 320-*b* and 320-*c* may be opened after transferring the sample into the load lock to pump the load lock again. The valve 335 may be closed after transferring the sample into the load lock. In some cases, the valves 320-*b* and 320-*c* can be opened for a predetermined amount of time (e.g., 5 minutes) prior to or after transfer. In some cases, the valves 320-*b* and 320-*c* can be opened until a predetermined pressure threshold is met (e.g., via a pressure sensor located within the load lock chamber).

At Stage 6), the valve 320-*a* and valve 320-*b* are closed, thereby closing the fluid pathway from the vacuum coupler to the load lock. The load lock is substantially sealed (e.g., under vacuum). The holder capsule of the sample holder 315 is opened, thereby exposing the sample 310 to the environment of the load lock chamber (e.g., under vacuum).

At Stage 7), valve 320-*a* is opened to provide the fluid pathway connecting the protecting gas source and the load lock chamber. As the holder capsule of the sample holder is opened, the sample 310 within the load lock chamber is exposed to the protecting gas flowing into the load lock chamber. The holder capsule can be sealed when the load lock is filled with the protecting gas.

At Stage 8), the holder capsule is closed/sealed. The valve 320-*a* is closed, and valves 320-*b* and 320-*c* are opened, thereby closing the fluid pathway of the load lock and the protecting gas source, and opening the fluid pathway of the load lock and the vacuum pump. The protecting gas is removed from the load lock. Subsequently, the sample can be transferred from the load lock chamber to the external environment (e.g., an adjacent glove box, the ambient environment, and the like) by removing the sample holder 315 from the goniometer.

The process (Stages 5-8) described with reference to FIG. 3B thus provides improved management of sample removal from a microscope column. As the holder capsule at distal end of the sample holder can seal the defined cavity, the sample can be removed from the load lock while under a controlled environment (e.g., with a portion of inert gas within the cavity of the sample holder), which can mitigate damage or degradation of the sample while transferred from the load lock chamber to a glove box, the ambient environment, another load lock chamber, or any other (controlled or uncontrolled) environment. Further, the process described above also allows for the control of pressure gradients the sample experiences. Both the composition, and the pressure, the sample experiences while being transferred from the microscope column to the external environment can be controlled with granularity, such that the sample does not experience pressure swings that can ultimately damage the sample.

Figure 5:
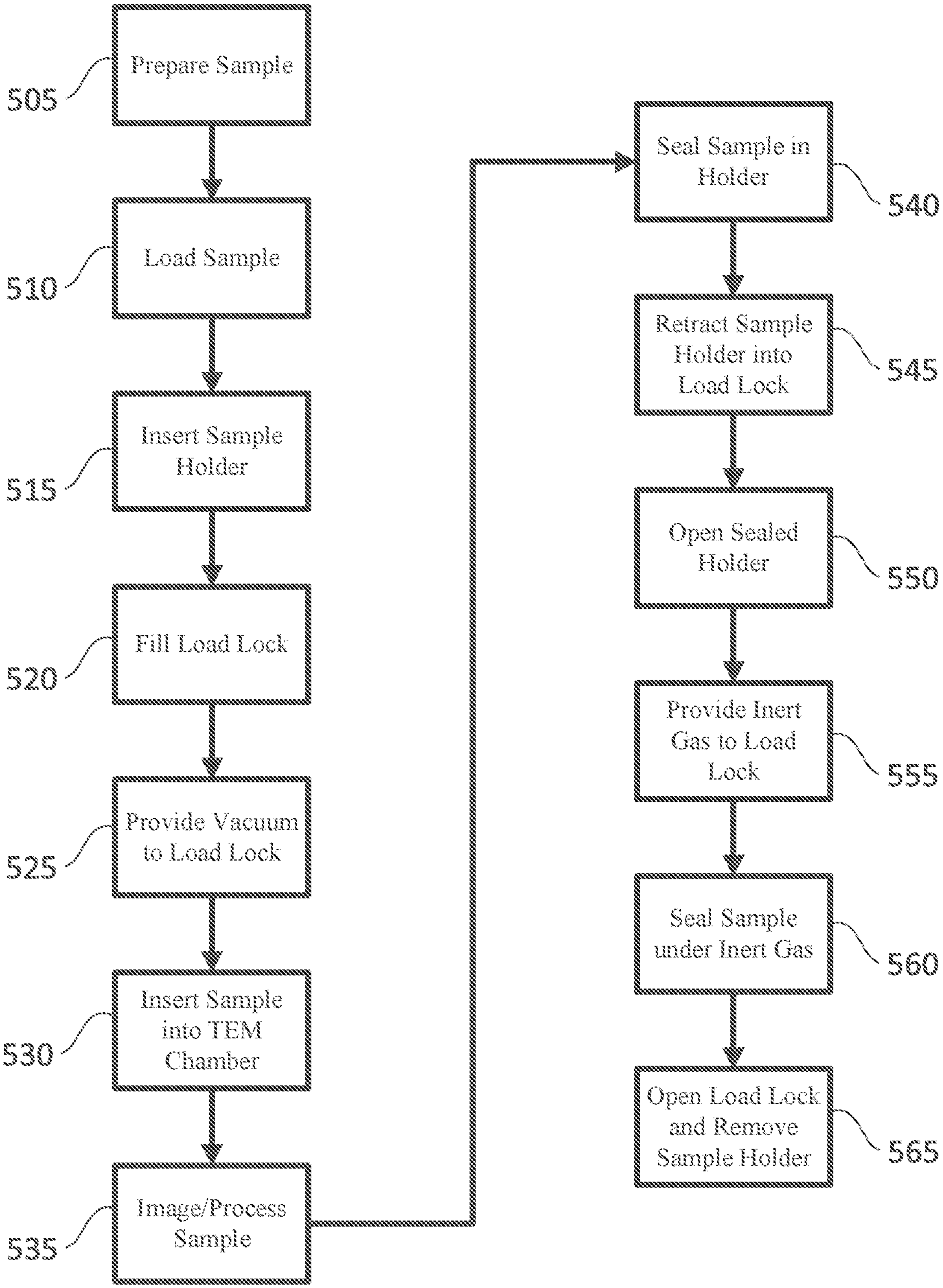
FIG. 5 depicts an example process flow for transferring a sample to and from a TEM.

FIG. 5 depicts a process for transferring a sample to and from a TEM column. In some cases, the process can include stages described above with reference to FIGS. 3A and 3B.

At Step 505, a sample can optionally be prepared in a glovebox. The glovebox can be located adjacent to an exterior opening of the load lock, such that a sample within the glovebox can be transferred from the interior of the glovebox to the cavity of the load lock without being exposed to ambient environment. Preparation of the sample can include cutting the sample from a larger body, adding a coating to the exterior surface of the sample, and the like.

At Step 510, the sample can be loaded into a sample holder under a protecting gas, for example, in the glovebox. In some cases, the environment of the glovebox can be controlled by, for example, filling the glovebox with a protecting gas. To mitigate exposure of the sample to compositions that can damage the sample, the glovebox can be filled with an inert gas prior to exposing the sample to the glovebox environment. If the sample is prepped in the glovebox, the inert gas can be flowed into the glovebox prior to preparing the sample. Further, loading the sample into the sample loader includes positioning the sample into the holder capsule and sealing (or closing) the holder capsule in the glovebox so that the sample is sealed in the holder capsule with the protecting gas. The sample holder can then be removed from the glovebox and transfer to the microscope. In other examples, the sample may be loaded into the sample holder in other sample preparation tools, such as in a charged particle tool.

At Step 515, at least a distal end of the sample holder is inserted into the load lock of the microscope. For example, the holder capsule holding the sample can be positioned within the interior of the load lock. By inserting the sample holder into the load lock, the sample holder is coupled to the goniometer and the load lock. After inserting the sample holder, the load lock is sealed from the external environment. As shown in Stage 1) of FIG. 3A, the distal end of the sample holder may be inserted in the load lock when the load lock is at ambient pressure and sealed from the sample chamber.

In some examples, before inserting the sample holder into the load lock, the load lock can be purged with gases, such as the protecting gas, one or multiple times (e.g., filling the load lock with the protecting gas, and then evacuating the protecting gas via the vacuum pump). In some cases, the purging can help remove the water content in the load lock.

At Step 520, the load lock is optionally filled with the protecting gas. Filling the load lock with the protecting gas can include first removing any gas from the load lock, for example, by opening valves 320-*b* and 320-*c* and operating the vacuum pump. Valve 320-*b* is then closed and valve 320-*a* is opened to flow the protecting gas into the load lock. The protecting gas can include, for example, nitrogen, helium, argon, krypton, xenon, and radon. In some case, the inert gas type can be selected based on the composition of the sample. In some cases, the filling of the load lock can be performed for a predetermined time period, or in some cases, the filling of the load lock can be performed according to a pressure of the interior of the load lock. In some cases, the load lock can be evacuated prior to the filling with the protecting gas. For example, once the sample holder is positioned within the load lock, the load lock can be evacuated to remove any gases within the load lock.

Once the load lock is filled, the holder capsule of the sample holder can be opened, thereby exposing the sample to the inert gas of the load lock.

At Step 525, a vacuum is provided to the load lock. The vacuum can be provided by flowing the protecting gas from the load lock to external the load lock via operating the vacuum pump. By providing vacuum to the load lock, the protecting gas within the holder capsule can be removed. Stage 2) of FIG. 3A shows that the valves 320-*b* and 320-*c* are opened for providing the vacuum when the holder capsule is unsealed under the protecting gas in the load lock. In some cases, the valves 320-*b* and 320-*c* can remain open (and the vacuum pump operating) until a vacuum is created within the load lock chamber. In some cases, the valves 320-*b* and 320-*c* can remain open and the vacuum pump operational) for a predefined period of time (e.g., 1 minute, 5 minutes, etc.). In some cases, the valves 320-*b* and 320-*c* can remain open (and the vacuum pump operational) until a predefined pressure threshold is met (e.g., via a pressure senor positioned within the load lock chamber). In the case where protecting gas is not used to fill the load lock in Step 520, the holder capsule can be opened during the evacuation of Step 525. The vacuum can remove any protecting gas that is introduced to the load lock from the sample holder. Stage 3) of FIG. 3A shows an unsealed holder capsule under vacuum, after the protecting gas is removed from the load lock.

At Step 530, the sample is inserted into the vacuum chamber of the TEM. Inserting the sample into the vacuum chamber can include opening the valve between the load lock and vacuum chamber, therefore forming a passage between the load lock and the vacuum chamber (e.g., the sample chamber). The holder capsule can be transferred from the load lock into the vacuum chamber, for example by further inserting the sample holder further into the sample chamber, therefore exposing the sample to the vacuum chamber environment. Stage 4) of FIG. 3A shows the sample inserted into the sample chamber.

At Step 535, the sample is imaged or processed within the sample chamber. The imaging can occur via a charged particle source generating a charged particle beam that interacts with the specimen. A detector or camera can capture portions of the charged particle beam, or emissions resulting from the charged particle beam interacting with the sample, to produce an image. The sample can be processed by a charged particle beam.

At Step 540, the holder capsule is optionally closed, thereby sealing the sample within the holder capsule under vacuum. The sealing can occur while the sample is in the vacuum chamber.

At Step 545, the sample, positioned in the holder capsule, is retracted into the load lock. For example, valves 320-*b* and 320-*c* are opened and the load lock is pumped down by operating the vacuum pump. When the load lock reaches a proper vacuum, the capsule is retracted into the load lock by operating the sample holder. In some examples, valves 320-*b* and 320-*c* are opened after sample is transferred into the load lock. Further, after the sample is transferred into the load lock, valved 335 is closed, sealing the sample chamber from the load lock. Stage 5) of FIG. 3B shows a sealed holder capsule retracted into the load lock. In some examples, the holder capsule is retracted from the sample chamber into the load lock while unsealed.

At Step 550, the holder capsule is opened in the load lock if the holder capsule is sealed. The holder capsule is unsealed to expose the sample to the environment of the load lock (which is under vacuum). Stage 6) of FIG. 3B shows the unsealed holder capsule in the load lock.

At Step 555, the protecting gas is flowed into the load lock. The protecting gas can be flowed into the load lock by fluidically connect the load lock and the protecting gas source, such as by opening valve 320-*a*. In some cases, the filling of the load lock can be performed for a predetermined time period, or in some cases, the filling of the load lock can be performed according to a pressure of the interior of the load lock. The valve 320-*a* can be opened for a predefined period of time (e.g., 10 seconds). In some cases, the valve 320-*a* can be opened until a predetermined pressure threshold is met (e.g., via a pressure sensor located within the load lock chamber). In some cases, the amount of fluid flowed into the load lock chamber creates an internal pressure of the chamber greater than 1 atm (e.g., which can occur in anticipation of some fluid leakage from the cavity of the sample holder when closed). Stage 7) of FIG. 3B shows the load lock filled with protecting gas after open valve 320-*a*.

At Step 560, the sample is sealed in the holder capsule under the protecting gas. Sealing the holder capsule while the load lock is filled with the protecting gas can seal the sample, and in some cases a portion of the protecting gas, within the sample holder. In some cases, the portion of protecting gas can be over 1 atm. After sealing the holder capsule, the protecting gas can be removed from the load lock by operating the vacuum pump. Stage 8) of FIG. 3B shows the protecting gas removed from the load lock after sealing the holder capsule.

At Step 565, the load lock is opened and the sample holder can be removed from the load lock. The load lock can be opened via an O-ring positioned between the load lock and the external environment (e.g. an adjacent glovebox).

What is claimed:

1. A method for transferring a sample out of a vacuum chamber of a transmission electron microscope (TEM), comprising:

transferring the sample positioned in a holder capsule of a TEM sample holder from the vacuum chamber of the TEM into a load lock of the TEM;

filling the load lock with a protecting gas;

sealing the holder capsule of the TEM sample holder under the protecting gas; and removing the TEM sample holder from the load lock.

2. The method of claim 1, wherein the load lock is a part of a goniometer for positioning the sample in the vacuum chamber.

3. The method of claim 1, wherein sealing the holder capsule under the protecting gas includes sealing the holder capsule when a pressure of the protecting gas in the load lock is over 1 atm.

4. The method of claim 1, wherein the transferring the sample from the vacuum chamber of the TEM to the load lock occurs while the TEM sample holder is coupled to a goniometer.

5. The method of claim 1, wherein the protecting gas is selected according to a type of the sample.

6. The method of claim 1, wherein sealing the sample chamber comprises retrieving the holder capsule into a cylindrical part of the TEM sample holder.

7. The method of claim 6, wherein, when the holder capsule is retrieved, the TEM sample holder defines a cavity that houses the sample and a portion of the inert gas contained in the load lock.

8. The method of claim 1, wherein the protecting gas includes one or more inert gases.

9. The method of claim 1, wherein the transferring the sample occurs under vacuum.

10. The method of claim 1, wherein the filling comprises:

opening a valve in fluid communication with an protecting gas source so as to effect fluid communication of the protecting gas into the load lock; and closing the valve based at least in part on one or more of:

(a) a duration of a time period during which the valve places the load lock in fluid communication with the protecting gas source; or (b) a pressure value within the load lock.

11. The method of claim 1, further comprising sealing the holder capsule in vacuum chamber before transferring the sample from the vacuum chamber into the load lock;

and unsealing the holder capsule in the load lock before filling the load lock with the protecting gas.

12. A method for transferring a sample into a vacuum chamber of a transmission electron microscope (TEM), comprising:

coupling a TEM sample holder to a load lock of the TEM;

providing a first vacuum in the load lock;

filling the load lock with a protecting gas;

unsealing a holder capsule of the TEM sample holder, wherein the sample is positioned in the holder capsule;

providing a second vacuum in the load lock; and transferring the sample from the load lock to the vacuum chamber of the TEM.

13. The method of claim 12, wherein the load lock is part of a goniometer, and wherein by coupling the TEM sample holder to the load lock of the TEM, the TEM sample holder is also coupled to the goniometer.

14. The method of claim 12, wherein the protecting gas is selected according to a type of the sample.

15. The method of claim 12, wherein unsealing the holder capsule comprises removing the holder capsule away from a cylindrical part of the TEM sample holder by operating a sample post.

16. The method of claim 12, wherein the protecting gas comprises argon, helium, xenon, neon, or a combination thereof.

17. The method of claim 12, wherein the filling comprises:

opening a valve in fluid communication with a protecting gas source so as to effect fluid communication of the protecting gas into the load lock; and closing the valve based at least in part on one or more of:

(a) a duration of a time period during which the valve places the load lock in fluid communication with the protecting gas source; or (b) a pressure value within the load lock.

18. The method of claim 12, further comprising imaging or processing the sample in the vacuum chamber of the TEM.

19. An apparatus for transferring the sample, comprising:

the load lock;

a protecting gas source;

a vacuum pump;

a gas delivery train configured to place the load lock into interruptible fluid communication with both the protecting gas source and with the vacuum pump; and a controller configured to perform the method of claim 1.

20. The apparatus of claim 19, further comprising a pressure sensor coupled to the load lock to measure a pressure in the load lock.

* * * * *